(12) United States Patent
Roca I Cabarrocas et al.

(10) Patent No.: US 8,404,052 B2
(45) Date of Patent: Mar. 26, 2013

(54) METHOD FOR CLEANING THE SURFACE OF A SILICON SUBSTRATE

(75) Inventors: Pere Roca I Cabarrocas, Villebon sur Yvette (FR); Mario Moreno, Palaiseau (FR)

(73) Assignees: Centre National de la Recherche Scientifique, Paris (FR); Ecole Polytechnique, Palaiseau (FR)

( * ) Notice: Subject to any disclaimer, the term of this patent is extended or adjusted under 35 U.S.C. 154(b) by 0 days.

(21) Appl. No.: 13/391,841

(22) PCT Filed: Aug. 23, 2010

(86) PCT No.: PCT/FR2010/051755
§ 371 (c)(1),
(2), (4) Date: Feb. 23, 2012

(87) PCT Pub. No.: WO2011/023893
PCT Pub. Date: Mar. 3, 2011

(65) Prior Publication Data
US 2012/0145185 A1    Jun. 14, 2012

(30) Foreign Application Priority Data
Aug. 24, 2009 (FR) ...................................... 09 55766

(51) Int. Cl.
*C25F 3/02* (2006.01)
(52) U.S. Cl. ............. 134/1.1; 216/24; 216/67; 438/710; 438/719; 438/723; 438/906; 257/E21.226; 257/E21.227; 134/1.2; 134/19; 134/21; 134/26; 134/30; 134/34; 134/35; 134/36; 134/37; 134/42; 134/902

(58) Field of Classification Search ............... 216/24, 216/67; 438/710, 719, 723, 906; 257/E21.226, 257/E21.227; 134/1.1, 1.2, 19, 21, 26, 30, 134/34, 35, 36, 37, 42, 902
See application file for complete search history.

(56) References Cited

U.S. PATENT DOCUMENTS

| 7,018,928 B2* | 3/2006 | Hsu et al. ...................... 438/705 |
| 2012/0208358 A1* | 8/2012 | Roca I Cabarrocas et al. ........................... 438/509 |

* cited by examiner

Primary Examiner — Bibi Carrillo
(74) Attorney, Agent, or Firm — Young & Thompson

(57) ABSTRACT

A method for cleaning the surface of a silicon substrate, covered by a layer of silicon oxide includes: a) exposing the surface for 60 to 900 seconds to a radiofrequency plasma, generated from a fluorinated gas, to strip the silicon oxide layer and induce the adsorption of fluorinated elements on the substrate surface, the power density generated using the plasma being 10 mW/cm$^2$ to 350 mW/cm$^2$, the fluorinated gas pressure being 10 mTorrs to 200 mTorrs, and the substrate temperature being lower than or equal to 300° C.; and b) exposing the surface including the fluorinated elements for 5 to 120 seconds to a hydrogen radiofrequency plasma, to remove the fluorinated elements from the substrate surface, the power density generated using the plasma being 10 mW/cm$^2$ to 350 mW/cm$^2$, the hydrogen pressure being 10 mTorrs to 1 Torr, and the substrate temperature being lower than or equal to 300° C.

9 Claims, 1 Drawing Sheet

METHOD FOR CLEANING THE SURFACE OF A SILICON SUBSTRATE

FIELD OF THE INVENTION

The invention relates to a method of cleaning the surface of a silicon substrate for the fabrication of a heterojunction solar cell.

Crystalline silicon solar cells are widely used in the photovoltaics industry because of their high efficiencies.

Heterojunction solar cells can be used to obtain high efficiencies (>22%) even for solar cells obtained from a very thin wafer of silicon (~100 μm [micrometer]).

BACKGROUND OF THE INVENTION

It is known that after a step of texturizing the surface, silicon substrates undergo a wet chemical etching step to clean the surface of the silicon substrate, i.e. to remove the layer of silicon oxide ($SiO_2$) that forms naturally on the surface of the substrate. That wet chemical method is known from the document by Karen Reinhardt and Werner Kern "Handbook of Semiconductor Wafer Cleaning Technology", $2^{nd}$ edition (2007).

That wet chemical cleaning method requires the use of solutions such as those based on hydrofluoric acid (HF), for example, and deionized water.

However, the relatively large quantity of deionized water and chemicals used in those wet processes represents a major source of pollution and incurs high fabrication costs.

SUMMARY OF THE INVENTION

Thus, the aim of the invention is to provide a method of cleaning the surface of a silicon substrate using a dry technique that can avoid the use of polluting liquid chemicals and reduce fabrication costs.

To this end, the invention provides a method of cleaning the surface of a silicon substrate, said surface initially being covered with a layer of silicon oxide.

In accordance with the invention, the method comprises the following steps:

a) exposing said surface to a radiofrequency plasma generated from a fluorinated gas in a reaction chamber, resulting in stripping the layer of silicon oxide and causing fluorinated elements to be adsorbed onto the surface of the silicon substrate, said exposure being carried out for a period in the range 60 s [second] to 900 s, the power density generated by the plasma being in the range 10 mW/cm² [milliwatt per square centimeter] to 350 mW/cm², the pressure of the fluorinated gas in the reaction chamber being in the range 10 mTorr [millitorr] to 200 mTorr, and the temperature of the silicon substrate being 300° C. or less; and b) exposing said surface including the fluorinated elements to a hydrogen radiofrequency plasma in the reaction chamber, to eliminate said fluorinated elements from the surface of the substrate, said exposure being carried out for a period in the range 5 s to 120 s, the power density generated by the plasma being in the range 10 mW/cm² to 350 mW/cm², the pressure of hydrogen in the reaction chamber being in the range 10 mTorr to 1 Torr, and the temperature of the silicon substrate being 300° C. or less.

In various possible implementations, the present invention also provides the following features that may be considered in isolation or in any of their technically feasible combinations, each providing specific advantages:

during steps a) and b), the power of the radiofrequency plasma is 10 W [watt];

during step a), the fluorinated gas used is a $SiF_4$ gas;

during step a), the pressure of $SiF_4$ in the reaction chamber is 30 mTorr; and step a) is carried out for a period of 380 s;

during steps a) and b), the temperature of the silicon substrate is 150° C.;

the duration of step b) is 30 s, the hydrogen pressure in the reaction chamber being 500 mTorr;

the reaction chamber is a chamber of a plasma enhanced chemical vapor deposition reactor.

Thus, the invention provides a method of cleaning the surface of a silicon substrate using a dry technique that can avoid the use of polluting liquid chemicals and reduce fabrication costs.

In addition, the electro-optic properties of the substrates obtained with the method of the invention are close to those obtained with prior art wet techniques.

This method can also be used to carry out the main steps in the fabrication of solar cells in a cluster comprising a plurality of reaction chambers (for texturizing, etching, deposition). The various vacuum chambers communicate between one another, thus avoiding contamination of the substrate by external pollutants.

BRIEF DESCRIPTION OF THE DRAWING

The invention is described below in more detail with reference to the accompanying drawings, in which.

DETAILED DESCRIPTION OF THE INVENTION

Figure 1:
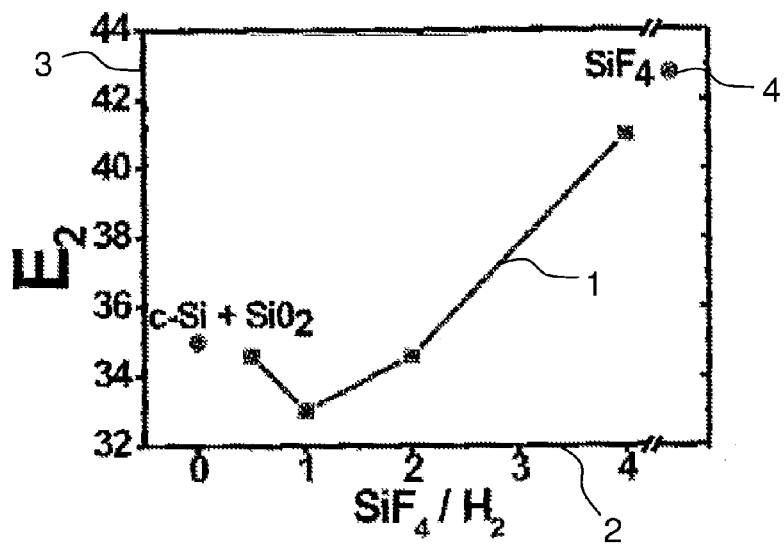
FIG. 1 shows values of $E_2$ for various $SiF_4/H_2$ ratios used during step a)

In one implementation of the invention, the method of cleaning the surface of a silicon substrate initially covered with a layer of native silicon oxide includes a step a) of exposing the surface to a radiofrequency plasma generated from a fluorinated gas in a reaction chamber, resulting in stripping the layer of silicon oxide by gas phase etching (dry technique).

A fluorinated gas is injected into the reaction chamber of a plasma enhanced chemical vapor deposition reactor (PECVD). The plasma excited by a radiofrequency voltage (RF) comprises fluorine-based elements (molecules, atoms, ions).

This step a) is carried out for a period in the range 60 s to 900 s. The power of the plasma is in the range 1 W to 30 W, corresponding to a power density in the range 10 mW/cm² to 350 mW/cm². The pressure of the fluorinated gas is in the range 10 mTorr to 200 mTorr.

The fluorinated (or fluorine-based) gas is preferably a $SiF_4$ gas. Other fluorinated gases may be used such as $SF_6$, for example.

This step a) involves fixing or adsorbing fluorinated elements on the surface of the silicon substrate, causing surface defects, in particular broken Si bonds.

The method of cleaning the surface of the silicon substrate also includes a step b) of exposing the surface of the silicon substrate comprising fluorinated elements to a hydrogen radiofrequency plasma to remove the fluorinated elements from the surface of the silicon substrate.

The plasma obtained during steps a) and b) is a low temperature plasma (temperature of 300° C. or less).

This step b) is carried out for a period in the range 5 s to 120 s, and with a plasma power in the range 1 W to 30 W (power density in the range 10 mW/cm² to 350 mW/cm²).

The hydrogen pressure is in the range 10 mTorr to 1 Torr.

Steps a) and b) are carried out in a conventional plasma enhanced chemical vapor deposition reactor (PECVD), operating at a frequency of 13.56 MHz [megahertz].

During steps a) and b), the temperature of the silicon substrate is 300° C. or less.

The cleaning method of the invention may be used for any type of silicon substrate, for example monocrystalline (c-Si) or polycrystalline, p- or n-doped, and with orientation <100>, <110> or <111>, with resistivity in the range 0.5 Ω.cm [ohm-centimeter] to 30 Ω.cm, for example.

The imaginary portion of the pseudo-dielectric function (Im [∈]) of a silicon substrate can be measured by UV-visible ellipsometry in the energy range of 1.5 eV [electron volt] to 4.5 eV.

$E_2$ represents the value of Im [∈] at 4.2 eV (peak of Im [∈]). The amplitude of $E_2$ is linked to the surface quality of the silicon substrate and to the presence of $SiO_2$ on the surface of the substrate.

FIG. 1 represents values of $E_2$, 1, after 5 minutes exposure to RF plasma for various $SiF_4/H_2$ ratios.

The abscissa 2 represents the $SiF_4/H_2$ ratios and the ordinate 3 represents the amplitude of $E_2$.

The amplitude of $E_2$ increases with the $SiF_4/H_2$ ratio up to a maximum of 4 for a pure $SiF_4$ plasma. These results show that during step a), using a pure $SiF_4$ plasma is more effective in etching native $SiO_2$ than a plasma based on a mixture of $SiF_4/H_2$.

Figure 2:
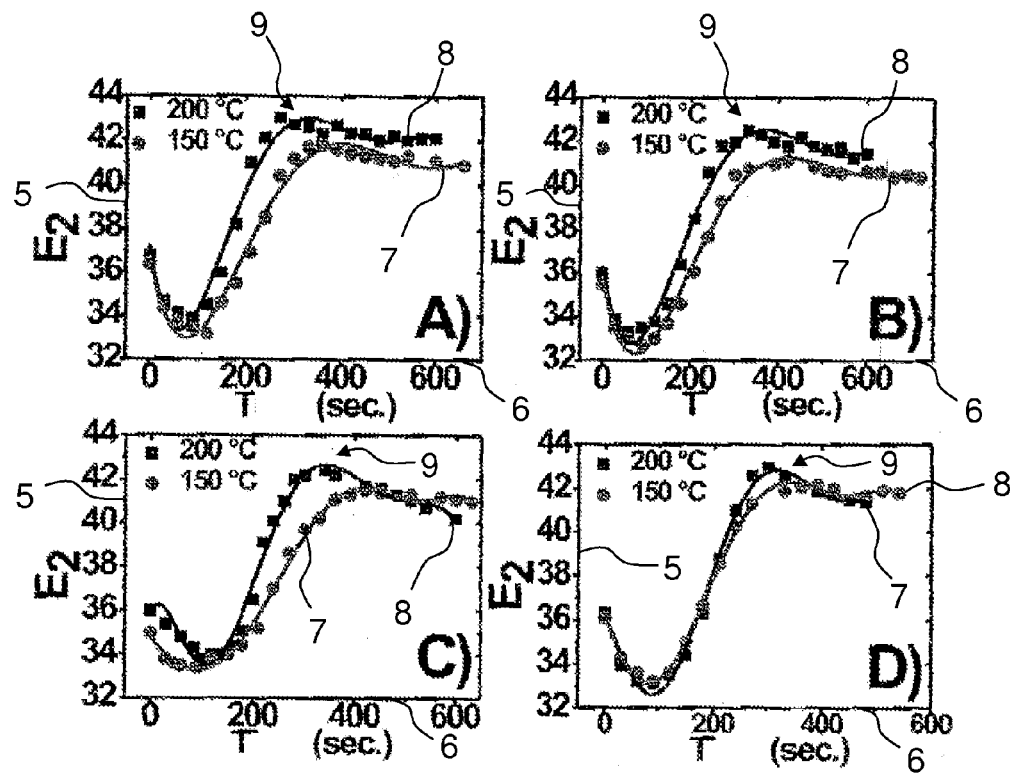
FIG. 2 shows the amplitude of $E_2$ as a function of the period of exposure to $SiF_4$ plasma during step a).

FIG. 2 represents the amplitude of $E_2$, 5, as a function of the period of exposure to $SiF_4$ plasma, 6, for 4 different substrates and for two substrate temperatures, 150° C. (curve 7) and 200° C. (curve 8).

Graph A corresponds to a p-doped substrate CZ<100> with a conductivity in the range 14 Ω.cm to 22 Ω.cm.

Graph B corresponds to a p-doped substrate FZ<100> with a conductivity in the range 5 Ω.cm to 10 Ω.cm.

Graph C corresponds to a n-doped substrate FZ<100> with a conductivity in the range 1 Ω.cm to 5 Ω.cm.

In general, for all of the substrates, at the start of the exposure to the plasma, the amplitude of $E_2$ decreases. At this stage, the plasma creates roughness during dry etching of $SiO_2$ from the surface of the silicon substrate.

After a longer plasma exposure period, the amplitude of $E_2$ increases to a maximum at 9, due to complete stripping of $SiO_2$.

For still longer plasma exposure periods, the amplitude $E_2$ decreases due to the roughness of the surface of the substrate induced by etching silicon with the $SiF_4$ plasma.

The time necessary for the amplitude of $E_2$ to reach a maximum depends on the temperature of the substrate. At 200° C., the optimum etching time is approximately 300 s for the four substrate types, while at 150° C., the optimum etching time is approximately 380 s.

When the $SiO_2$ was plasma etched at a substrate temperature of 200° C., the amplitude of $E_2$ is larger than that corresponding to etching carried out with a substrate temperature of 150° C., suggesting a better substrate quality.

However, high values of $E_2$ for a cleaned substrate do not necessarily imply that the electronic properties of the surface are suitable for solar cells.

In order to optimize the cleaning method, it is necessary to characterize the silicon substrate after a step of passivation of the surface of the substrate using a $SiH_4$ plasma. This passivation step is accomplished by covering the surface of the substrate with a layer of a-Si:H silicon.

Various treatments have been applied to the crystalline silicon substrate between step a) for exposure to $SiF_4$ plasma and the deposition of a-Si:H.

These studies are summarized in Table I. A FZ<100> n-type silicon substrate with a conductivity in the range 1 Ω.cm to 5 Ω.cm and with a thickness of 280 μm was used. A 40 nanometer layer of a-Si:H was then deposited on the two faces of the substrate using a pure $SiH_4$ plasma after eliminating native $SiO_2$, without breaking the vacuum in the reaction chamber.

The studies of Table I below allow optimized treatment conditions for effective cleaning of silicon substrates to be defined.

| | Conditions for cleaning method | | | | | Results after passivation | | | |
|---|---|---|---|---|---|---|---|---|---|
| | | Etching of $SiO_2$ with $SiF_4$ plasma (step a)) | | Plasma treatment before depositing a-Si:H | | Lifetime $\tau_{eff}$ before anneal | Lifetime $\tau_{eff}$ after anneal at | Voc | Surface recombination velocity |
| Experiment ref | $T_{sub}$ (° C.) | Power (W) | Time (s) | Gas | Time (s) | (ms) | 200° C. (ms) | (V) | (cm s⁻¹) |
| M0801105 Reference (HF) | 150 | No | No | | No | 1.71 | 1.75 | 0.722 | 8 |
| M090205 | 200 | 10 | 300 | | No | 0.017 | 0.014 | 0.551 | 1000 |
| M090205-2 | 150 | 10 | 380 | | No | 0.090 | 0.219 | 0.634 | 63 |
| M090206-1 | 150 | 10 | 380 | Epitaxy | 360 | 0.020 | 0.020 | 0.562 | 682 |
| M090209-1 | 150 | 10 | 380 | Ar | 60 | 0.018 | 0.031 | 0.624 | 444 |
| M0902010-2 | 150 | 10 | 380 | Ar | 30 | 0.118 | 0.163 | 0.648 | 85 |
| M0902010-1 | 150 | 10 | 380 | H2 | 60 | 0.899 | 0.961 | 0.694 | 14.5 |
| M090316-2 | 150 | 10 | 380 | H2 | 30 | 1.13 | 1.23 | 0.701 | 12.4 |
| M090212-1 | 150 | 5 | 380 | H2 | 30 | 1.51 | 1.55 | 0.716 | 9 |

Graph D corresponds to a n-doped substrate FZ<111> with a conductivity in the range 1 Ω.cm to 5 Ω.cm.

The power of the plasma was 10 W; the pressure in the reaction chamber was 30 mTorr; the SiF4 flow rate was 100 sccm [standard cubic centimeter per minute].

The reference substrate employed was a c-Si substrate cleaned with a standard solution of hydrofluoric acid diluted to 5% with deionized water. This substrate was then passivated on its two faces. A 40 mm layer of a-Si:H was deposited on these two faces. An effective lifetime ($\tau_{eff}$) for the charge carriers of 1.75 ms [millisecond] was obtained.

The effective lifetime ($\tau_{\textit{eff}}$) was obtained using an apparatus that measures the transient photoconductance (Sinton WTC-120). The sample was illuminated with a flash lamp in order to produce an excess of charge carriers in the c-Si substrate, creating a change in the conductivity of the substrate.

The dependence of $\tau_{\textit{eff}}$ on the excess carrier density ($\Delta n=\Delta p$) was then measured. The implicit Voc at a 1 sun illumination was deduced therefrom.

The effect of temperature on the substrate was analyzed first. Although the results concerning the SiF$_4$ plasma cleaning method suggest a better surface quality at 200° C. (see FIG. 2), a very low lifetime was obtained ($\tau_{\textit{eff}}$=17 µs [microsecond]) for the sample treated at 200° C. and covered with a layer of a-Si:H (see Table I).

However, the sample treated at 150° C. exhibited a lifetime of 90 µs after a deposit of a-Si:H and a lifetime of 0.219 ms after annealing at 200° C. for half an hour in ambient air.

For the sample treated at 200° C., annealing resulted in a slight degradation in the lifetime of the charge carriers.

It is thus deduced that for step a), a temperature of less than 200° C. was preferable. A temperature of 150° C. is ideal.

In order to improve the quality of the passivation layer on the surface of the silicon substrate, various plasma treatments after step a) for etching SiO$_2$ using SiF$_4$ plasma were tested, as shown in Table I. 40 nanometer thick epitaxial layers of silicon were deposited on the c-Si substrate before depositing the layer of a-Si:H, which did not produce any improvement in $\tau_{\textit{eff}}$. In fact, it was reduced to 20 µs, which is not surprising since there is then no heterojunction (no a-Si:H layer).

A treatment of the c-Si silicon substrate with argon plasma between step a) for exposure to SiF$_4$ plasma and depositing a-Si:H resulted in degradation of the electrical properties of the substrate.

The degradation of the electrical properties of the substrate is greater for a treatment with argon plasma lasting 60 s than for a treatment lasting 30 s. In both cases, annealing did not produce any substantial improvement in the lifetime of the charge carriers ($\tau_{\textit{eff}} \approx 163$ µs after annealing for the sample treated for 30 s).

Surprisingly, using step b) for exposing the substrate surface to a H$_2$ plasma produced an exceptional improvement in the electrical characteristics of the passivated samples. The $\tau_{\textit{eff}}$ increased up to 961 µs and up to 1.23 ms (after anneal) for hydrogen plasma treatment times of 60 s and 30 s respectively.

To reduce damage to the surface of the c-Si before depositing the layer of a-Si:H, during step a), the RF power of the SiF$_4$ plasma was reduced to 5 W. This step a) was followed by step b) in which a H$_2$ plasma was applied for 30 s. As predicted, the $\tau_{\textit{eff}}$ climbed to 1.5 ms (1.55 ms after annealing), which was comparable to the value of $\tau_{\textit{eff}}$ obtained for the reference sample.

The SiF$_4$ plasma used during step a) to eliminate the native oxide, SiO$_2$, produced dangling bonds between the silicon atoms at the surface of the substrate due to bombardment by the fluorinated ions.

A short exposure to H$_2$ plasma can passivate the surface of the substrate comprising these defects in a manner similar to that of the wet technique using hydrofluoric acid.

Measurements of the lifetime of the charge carriers could be used to obtain the implicit open circuit voltage (Voc) and the upper limit of the surface recombination velocity ($S_{\textit{eff}}$).

The values are close to those obtained with the prior art wet technique using hydrofluoric acid.

Preferably, during step a) for exposing the substrate surface to a low temperature radiofrequency plasma, a fluorinated gas, pure SiF$_4$, is used, without adding hydrogen or any other gas. SiF$_4$ gas alone was injected into the PECVD chamber during step a). The pressure of SiF$_4$ is 30 mTorr. The duration of step a) is 380 s.

Step b) for exposing the fluorinated surface to a low temperature hydrogen radiofrequency plasma is applied for 30 s.

During steps a) and b), the power of the radiofrequency plasma is in the range 5 W to 10 W, preferably 10 W, and the temperature of the silicon substrate is 150° C.

In one possible implementation, after steps a) and b), the cleaning method comprises a step c) for depositing intrinsic or p- or n-doped amorphous silicon (a-Si:H), or other amorphous materials (such as a-SiC:H, a-SiGe:H or SiN$_x$, for example), with various thicknesses in the range 1 nm to 200 nm.

The cleaning method also comprises, after step c), a step d) for annealing the silicon substrate at a temperature in the range 150° C. to 300° C., for a period in the range 10 minutes to 120 minutes, preferably 30 minutes. This annealing step is optional.

A lifetime for the charge carriers of 1.55 ms is obtained, with an open circuit voltage of 0.716 V, and a surface recombination rate of 9 cm.s$^{-1}$.

In one possible implementation, during steps a) and/or b) and/or c), the power of the radiofrequency plasma is applied directly or increased gradually.

The method of the invention may be carried out in a single plasma enhanced chemical vapor deposition (PECVD) chamber. The steps a), b) and c) are carried out in the same chamber (PECVD), to prevent breaking the vacuum, to avoid contaminating the substrate by external pollutants, to increase the rapidity of the cleaning method and to reduce the fabrication costs.

The method of the invention may be applied to one or both opposed faces of a silicon substrate.

The invention claimed is:

1. A method of cleaning a surface of a silicon substrate, said surface being covered with a layer of silicon oxide; characterized in that the method comprises the following steps:
    a) exposing said surface to a radiofrequency plasma generated from a fluorinated gas in a reaction chamber, resulting in stripping the layer of silicon oxide and causing fluorinated elements to be adsorbed onto the surface of the silicon substrate, said exposure being carried out for a period in a range of 60 s to 900 s, a power density generated by the plasma being in a range of 10 mW/cm$^2$ to 350 mW/cm$^2$, the pressure of the fluorinated gas in the reaction chamber being in the range 10 mTorr to 200 mTorr, and the temperature of the silicon substrate being 300° C. or less; and
    b) exposing said surface including the fluorinated elements to a hydrogen radiofrequency plasma in said reaction chamber, to eliminate said fluorinated elements from the surface of the substrate, said exposure being carried out for a period in a range of 5 s to 120 s, a power density generated by the plasma being in a range of 10 mW/cm$^2$ to 350 mW/cm$^2$, the pressure of hydrogen in the reaction chamber being in the range 10 mTorr to 1 Torr, and the temperature of the silicon substrate being 300° C. or less.

2. A method of cleaning the surface of a silicon substrate according to claim 1, characterized in that during steps a) and b), a power of the radiofrequency plasma is 10 W.

3. A method of cleaning the surface of a silicon substrate according to claim 1, characterized in that during step a), the fluorinated gas used is a $SiF_4$ gas.

4. A method of cleaning the surface of a silicon substrate according to claim 1, characterized in that during step a), the pressure of $SiF_4$ in the reaction chamber is 30 mTorr.

5. A method of cleaning the surface of a silicon substrate according to claim 1, characterized in that step a) is carried out for a period of 380 s.

6. A method of cleaning the surface of a silicon substrate according to claim 1, characterized in that during steps a) and b), the temperature of the silicon substrate is 150° C.

7. A method of cleaning the surface of a silicon substrate according to claim 1, characterized in that the duration of step b) is 30 s, the hydrogen pressure in the reaction chamber being 500 mTorr.

8. A method of cleaning the surface of a silicon substrate according to claim 1, characterized in that the reaction chamber is a chamber of a plasma enhanced chemical vapor deposition reactor.

9. A method of cleaning the surface of a silicon substrate according to claim 2, characterized in that during step a), the fluorinated gas used is a $SiF_4$ gas.

* * * * *